(12) United States Patent
Sun et al.

(10) Patent No.: US 7,679,083 B2
(45) Date of Patent: Mar. 16, 2010

(54) SEMICONDUCTOR INTEGRATED TEST STRUCTURES FOR ELECTRON BEAM INSPECTION OF SEMICONDUCTOR WAFERS

(75) Inventors: Min Chul Sun, Hwasung-si (KR); Scott Jansen, East Fishkill, NY (US); Randy Mann, Poughquag, NY (US); Oliver D. Patterson, Poughkeepsie, NY (US)

(73) Assignees: Samsung Electronics Co., Ltd., Suwon-Si (KR); International Business Machines Corporation, Armonk, NY (US); Infineon Technologies AG, Neubiberg (DE)

( * ) Notice: Subject to any disclaimer, the term of this patent is extended or adjusted under 35 U.S.C. 154(b) by 391 days.

(21) Appl. No.: 11/694,449

(22) Filed: Mar. 30, 2007

(65) Prior Publication Data
US 2008/0237586 A1    Oct. 2, 2008

(51) Int. Cl.
*H01L 23/58*    (2006.01)

(52) U.S. Cl. .......................................... 257/48; 438/14
(58) Field of Classification Search .................. 257/48; 438/14
See application file for complete search history.

(56) References Cited

U.S. PATENT DOCUMENTS

| 5,962,867 A | 10/1999 | Liu |
| 2003/0001598 A1 | 1/2003 | Weiner et al. |

*Primary Examiner*—Long Pham
(74) *Attorney, Agent, or Firm*—F. Chau & Associates, LLC

(57) ABSTRACT

Semiconductor integrated test structures are designed for electron beam inspection of semiconductor wafers. The test structures include pattern features that are formed in designated test regions of the wafer concurrently with pattern features of integrated circuits formed on the wafer. The test structures include conductive structures that are designed to enable differential charging between defective and non-defective features (or defective and non-defection portions of a given feature) to facilitate voltage contrast defect detection of CMOS devices, for example, using a single, low energy electron beam scan, notwithstanding the existence of p/n junctions in the wafer substrate or other elements/features.

19 Claims, 6 Drawing Sheets

FIG.1

(Prior Art)

(Prior Art)

Secondary Electron Yield Curve

Landing Energy (eV)  $\delta = \dfrac{\text{electrons out}}{\text{electrons in}}$

SEMICONDUCTOR INTEGRATED TEST STRUCTURES FOR ELECTRON BEAM INSPECTION OF SEMICONDUCTOR WAFERS

TECHNICAL FIELD OF THE INVENTION

The present invention relates generally to semiconductor integrated test structures for electron beam inspection of semiconductor wafers and, in particular, semiconductor integrated test structures that are formed in test regions of a semiconductor wafer to detect electrical and physical defects through voltage contrast inspection of the integrated test structures.

BACKGROUND

Due to continuing technological innovations in the field of semiconductor fabrication, integrated circuit chips are being developed with larger scale of integration and higher device density, as well as lower power consumption and higher operating speeds. In general, integrated circuits are manufactured using FEOL (front-end-of-line) processing technologies to form discrete semiconductor devices within the surface of a silicon wafer followed by BEOL (back-end-of-line) processing techniques to form a multi-level metallurgical interconnection network over the semiconductor devices to provide the wiring and contacts between the semiconductor devices to create the desired circuits. When semiconductor integrated circuits are designed based on sub-micron dimensions and beyond, it is very important that tight dimensional control is achieved since slight variations in processing conditions can generate significant dimensional deviations of the patterned features or other electrical defects. In this regard, semiconductor wafers are typically inspected at various stages/levels of development to ensure quality control and detect and eliminate critical, yield-limiting defects.

For example, electron beam inspection is a common technique that is employed using an SEM (scanning electron microscope) to detect electrical and physical defects on a semiconductor wafer through voltage contrast inspection of a secondary electron image. In general, electron beam voltage contrast inspection involves scanning a target region of the wafer with a focused electron beam emitted by an SEM. The electron beam irradiates the target region causing the emission of secondary electrons and a secondary electron detector measures the intensity of the secondary electron emission along the scan path of the electron beam. As a region is scanned, electrons from the electron beam induce surface voltages that vary over the scanned region due to differential charge accumulation of the irradiated features. Voltage contrast inspection operates on the principle that differences in the induced surface voltages over a scanned region will cause differences in secondary electron emission intensities.

In general, for a given feature, the intensity of secondary electron emission will vary depending on, e.g., the landing energy of the beam electrons (primary electrons) and material composition of the feature. For a given material, a secondary electron yield $\delta$ is a measure of a ratio of secondary electron emission to impinging primary electrons as a function of landing energy (eV), i.e., $$\delta = \frac{\text{Secondary Electrons Emitted}}{\text{Electrons In}}.$$

Different materials irradiated by an electron beams tuned to a specific landing energy will emit different intensities of secondary electrons. The different features within the scanned target region will be displayed in an SEM image with different grayscale shades depending on the intensity of secondary electron emission. The irradiated features having a higher intensity of secondary electron emission may be displayed brighter in an SEM image than those irradiated features having a lower intensity of secondary electron emission.

Figure 1:
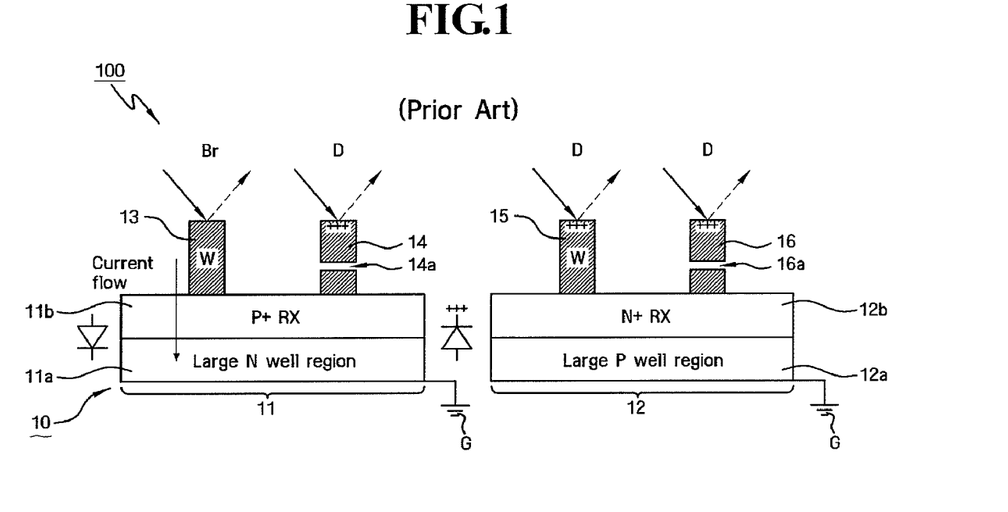
FIG. 1 schematically illustrates a conventional electron beam inspection process for voltage contrast inspection of metallic contacts/vias features of a CMOS integrated circuit.

One common application of e-beam inspection is to perform in-line voltage contrast inspection of conductive features such as interconnects and through-vias to detect electrical defects such as electrical shorts, electrical opens, or resistive shorts/opens, etc. For conductive features, electrical defects can be detected as voltage contrast defects due to charging differences between defective structures and non-defective structures. For instance, FIG. 1 schematically illustrates a conventional electron beam inspection process for voltage contrast inspection of metallic contacts/vias features of a CMOS integrated circuit. In particular, FIG. 1 schematically illustrates a conventional voltage contrast inspection process to detect electrical defects for through-via contacts in a target region (10) of a semiconductor wafer substrate having a first active region (11) and a second active region (12) of a CMOS integrated circuit. The first active region (11) may be a PMOS region comprising an n-well region (11a) and a p+ diffusion region (11b), and the second active region (12) may be an NMOS region comprising a p-well region (12a) and an n+ diffusion region (12b).

A plurality of contacts (13) and (14) are formed on the p+ diffusion region (11b) in the first region (11) and a plurality of contacts (15) and (16) are formed on the n+ diffusion region (12b) in the second region (12). The contacts (13~16) are formed in an insulating layer (not shown). The contacts (13) and (14) may be metal contacts (e.g., tungsten plugs) that are formed as part of a CMOS integrated circuit to connect the p+ diffusion region (11b) (source/drain) of a PMOS transistor to first level metallization. Similarly, the contacts (15) and (16) may be metal contacts (e.g., tungsten plugs) that are formed to connect the n+ diffusion region (12b) (source/drain) of an NMOS transistor to first level metallization. In the illustrative embodiment of FIG. 1, the contacts (14) and (16) are depicted as defective structures having electrical open defects (14a) and (16a), respectively, while the contacts (13) and (15) are depicted as non-defective structures. The electrical open defects can be readily detected using e-beam inspection due to the sharp voltage contrast differences that would result from differential charging between the defective and non-defective contacts.

In particular, during an electron beam inspection, the semiconductor wafer would be electrically connected to SEM ground (G) or some reference voltage source to control charge build up on the scanned region due to electron beam irradiation. When irradiated by the electron beam, charge accumulation on non-defective contacts (13), (15) would be discharged to SEM ground G through the wafer substrate while charge accumulation on the defective contacts (14), (16) would not foe discharged to SEM ground G due to the open defects (14a), (16a), resulting in differential charge accumulation and thus, different intensities of secondary electron emission. When examined with an SEM in secondary electron emission mode, the differentially charged non-defective contacts (13), (15) and defective contacts (14), (16) would appear in the SEM image with different intensities.

In the conventional embodiment of FIG. 1, two electron beam scans are required to adequately detect voltage contrast defects of contacts in the first and second regions (11) and (12) due to the presence of semiconductor p/n junctions (11b/11a) and (12a/12b) of the respective first and second active regions (11) and (12). For a given scan, the charge accumulation on the contacts (13~16) may be either positive or negative, depending on the secondary electron yield $\delta$ of the material forming the contacts (13~16). In this regard, for a given scan, the p/n junction of one of the first or second regions (11) and (12) can be reversed biased, thereby preventing charge build up on contacts within the given region (11) or (12) from being discharged to SEM ground G. Consequently, there would be very little or no charge differential between defective and non-defective contacts and, thus, no discernable contrast differences in an SEM image between defective and non-defective contacts in the given region.

Figure 8:
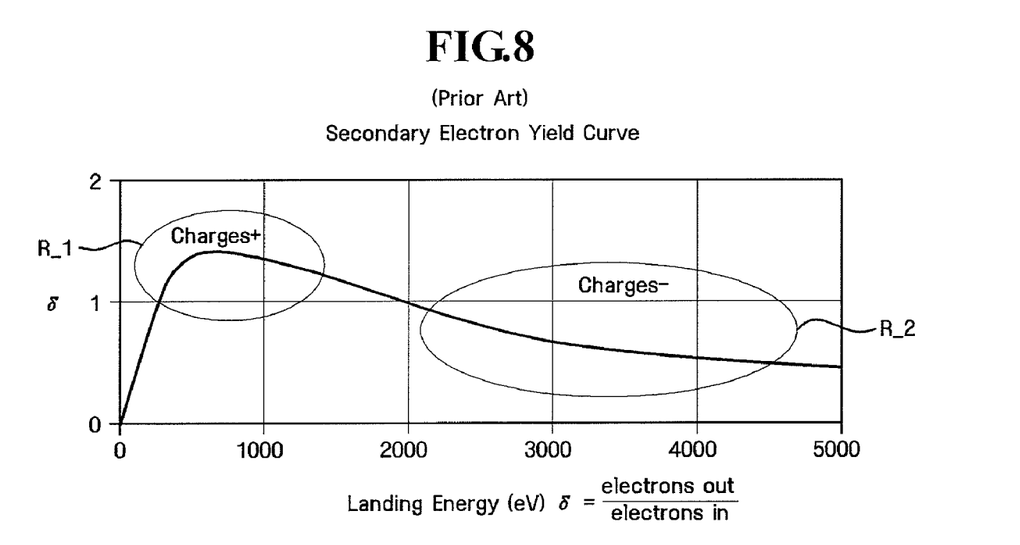
FIG. 8 is a graphical illustration of a secondary electron yield curve for tungsten.

By way of specific example, assume for illustrative purposes that the contacts (13-16) are formed of tungsten. FIG. 8 illustrates an electron yield curve for tungsten. FIG. 8 generally illustrates that the secondary electron yield $\delta$ for tungsten is greater than 1 for a range R_1 of low landing energies and less than 1 for a range R_2 of high landing energies. In this regard, electrically isolated tungsten contacts would be positively charged when irradiated with a low landing energy electron beam, while electrically isolated tungsten contacts would be negatively charged when irradiated with a high landing energy electron beam. FIG. 1 illustrates a voltage contrast inspection process to inspect the contacts (13) and (14) in the first region (11) using a low landing energy electron beam to irradiate the target region (10). The beam electrons (indicated by solid arrows) impinging on the top surface of the contacts (13, 14, 15, 16) would cause a positive charge to accumulate in the contacts (13, 14, 15, and 16).

In the first region (11), positive charge accumulation in the non-defective contact (13) causes the p/n junction (11b/11a) to be forward biased, which allows the positive charge to be discharged to the substrate ground G through the first substrate region (11). On the other hand, the positive charge that accumulates in the defective contact (14) is not discharged to substrate ground G due to the open defect (14a). The induced surface voltage on the defective contact (14) from positive charge accumulation operates to modulate the intensity of secondary electron emission by creating potential barriers reducing secondary electron emission. In particular, the positive charge build up on the defective contact (14) decreases the intensity of the secondary electron emission as compared to the non-defective contact (13). Therefore, when the potential state of the scanned region (11) is acquired as a voltage contrast image, the lower potential non-defective contact (13) in the first region (11) might be displayed as bright (i.e., the intensity of the secondary electron emission is high) whereas the higher potential defective contact (14) is displayed as dart (i.e., lower intensity secondary electron emission).

However, in the second region (12), the positive charge that accumulates in the non-defective contact (15) causes the p/n junction (12a/12b) to be reversed biased, which prevents the accumulated charge on the contact (15) from being discharged to substrate ground G. Consequently, for low landing energies, positive charge accumulates on both the non-defective contact (15) and defective contact (16) in the second region (12), which causes the voltage contrast between such contacts to be dramatically reduced (e.g., contacts (15) and (16) are positively charged and will appear as dark regions in the SEM image). In this regard, although the contact (15) is not defective, the contact (15) can appear in the SEM image as a dark region providing a false indication of being defective.

Therefore, in the conventional process of FIG. 1, a second scan at a high landing energy would be needed to adequately detect voltage contrast defects in the second region (12). As shown in FIG. 8, the electron yield $\delta$ for tungsten at high landing energies is less than 1 such that negative charge would accumulate in the contacts (13, 14, 15 and 16). In the second region (12), the negative charge that accumulates in the non-defective contact (15) would cause the p/n junction (12a/12b) to be forward biased, which allows the negative charge to be discharged to substrate ground G. On the other hand, the negative charge that accumulates in the defective contact (16) would not be discharged to substrate ground G due to the open defect (16a). In this regard, the charge differential between the contacts (15) and (16) would result in differences in secondary electron emission and thereby resulting in voltage contrast differences suitable for voltage contrast defect detection.

However, in the first region (11), the negative charge that accumulates on the non-defective contact (13) would cause the p/n junction (11b/11a) to be reversed biased, which prevents the negative charge from being discharged to the substrate ground G. Thus, negative charge build up on both contacts (13) and (14) in the first region (11) would dramatically reduce the voltage contrast differences between such contacts and make the non-defective contact (13) to appear defective (as compared to the non-defective contact (15) in the second region (12)).

Therefore, in the conventional embodiment of FIG. 1, two separate electron beams scans at different landing energies are required (low and high) to enable voltage contrast inspection of electrical open defects of the contacts in the first and second regions (11) and (12). This is undesirable for several reasons. For instance, the need to perform two e-beam scans at different landing energies increases the inspection time and analysis and cost. Moreover, performing a second scan using a high landing energy beam is problematic in that the high energy electron beam can lead to significant charge accumulation of inspected features, which can cause distortions in an SEM image in way that decreases the efficacy of voltage contrast inspection. Moreover, the high-levels of accumulated charges that results from high energy electron beam scans can cause damage to certain semiconductor integrated circuit elements, thus lowering yield.

SUMMARY OF THE INVENTION

In general, exemplary embodiments of the invention include semiconductor integrated test structures that are designed for electron beam inspection of semiconductor wafers to detect electrical and physical defects by voltage contrast inspection of the integrated test structures. Exemplary test structures are formed in designated test structure regions of a semiconductor wafer, and are designed to have dummy features corresponding to patterns, layout, and/or dimensions, etc., of integrated circuit features formed on the semiconductor wafer. The test structures are designed with conductive structures to facilitate detection of voltage contrast defects by ensuring differential charging between defective and non-defective features (or defective and non-defection portions of a given feature) as a result of scanning the test region using a single low energy electron beam scan, despite the presence of p/n junctions or other elements/features in the test structure that would otherwise prevent differential charging between defective and non-defective features.

In one exemplary embodiment of the invention, a semiconductor device includes an integrated device array formed on a semiconductor substrate, wherein a portion of the integrated device array comprises a test structure region. The test structure region comprises adjacent first and second active regions, a conductive pattern, an insulating layer and one or more contact plugs. The first active region comprises a p-doped diffusion region formed in an n-well and the second active region comprises an n-doped diffusion region formed in a p-well. The conductive pattern is formed on the first and second active regions to electrically connect the p-doped and n-doped active regions. The insulating layer is formed on the conductive pattern and the one or more contact plugs are formed in the insulating layer in contact with the conductive pattern. The conductive pattern may be formed of a silicide. The integrated circuit may be a memory cell array.

In other exemplary embodiments, the test structure region further includes a dummy gate line that is formed on the first and second active regions and electrically isolated from the n-doped and p-doped active regions. The conductive pattern may be a conductive line that extends parallel to the dummy gate line. The test structure region may further include one or more dummy contact plugs formed in the insulating layer in contact with the dummy gate line. In another exemplary embodiment of the invention, the test structure region my further include an isolation structure formed in the n-doped active region to form an electrical discontinuity of the conductive pattern.

In another embodiment of the invention, a semiconductor device is provided having an integrated device array formed on a semiconductor substrate, wherein a portion of the integrated device array comprises a test structure region. The test structure region includes adjacent first, second and third active regions, wherein the first active region comprises a first well region and a first diffusion region formed in the first well region, wherein the second active region comprises a second well region and a second diffusion region formed in the second well region, and wherein the third active region comprises a third well region and a third diffusion region formed in the third well region. The first well region, third well region and second diffusion region are doped with a first conductivity type, and the second well region and the first and third diffusion regions are doped with a second conductivity type opposite the first conductivity type. A conductive pattern is formed on the first, second and third active regions, wherein a first portion of the conductive pattern is formed in contact with, and bridging, the first diffusion region and the second diffusion region, and wherein a second portion of the conductive pattern is formed in contact with, and bridging, the second diffusion region and the third diffusion region. An isolation structure is formed in the second diffusion region and electrically isolating the first and second portions of the conductive pattern.

In yet another exemplary embodiment of the invention, a semiconductor fabrication process includes defining an integrated circuit region on a semiconductor wafer substrate, wherein the integrated circuit region includes a device array region and a test structure region. The exemplary method further includes forming a pattern of adjacent n-well and p-well regions in the device array and test structure regions, forming c-doped diffusion regions formed in the n-well regions and n-doped diffusion regions in the p-well regions of the device array and test structure regions, forming a dummy conductive pattern in the test structure region, wherein the dummy conductive pattern includes a bridge portion between adjacent n-well and p-well regions of the test structure region, and wherein the bridge portion provides a conductive path between a p-doped and n-doped diffusion region formed in the adjacent n-well and p-well regions, forming an insulating layer on the substrate, and forming a pattern of dummy contacts in the insulating layer in the adjacent n-well and p-well regions of the test structure region, wherein the dummy contacts are formed to contact the dummy conductive pattern.

In another exemplary embodiment, the process of forming a dummy conductive pattern in the test structure region includes forming a dummy metal silicide pattern representative a metal silicide features formed in the device array. The dummy metal silicide pattern may include a gate line pattern. An electron beam inspection process may be performed after forming the dummy conductive pattern by scanning the test structure region to inspect for voltage contrast defects in the dummy metal silicide pattern.

In another embodiment, the process may include forming an isolation region in at least one of the p-doped or n-doped diffusion regions in the test structure region to region, or in both to form an electrical discontinuity in the conductive pattern.

These and other exemplary embodiments, aspects, objects, features and advantages of the present invention will become apparent from the following detailed description of exemplary embodiments, which is to be read in connection with the accompanying drawings.

BRIEF DESCRIPTION OF THE DRAWINGS

FIG. 4A~4E schematically illustrate a method for voltage contrast inspection of a semiconductor integrated device array formed on a semiconductor wafer using semiconductor integrated test structures according to an exemplary embodiment of the invention, wherein FIG. 4A is a top plan schematic layout view of a device array having designated test regions, and wherein

DETAILED DESCRIPTION OF EXEMPLARY EMBODIMENTS

Exemplary embodiments of semiconductor test structures for use with e-beam contrast inspection to detect electrical defects on semiconductor wafers will now be described more fully with reference to the schematic illustrations of FIGS. 2-7, where it is to be understood that the thickness and dimensions of various structures, layers and regions of semiconductor devices illustrated in the Figures are not to scale but rather exaggerated for clarity. It is to be further understood that when a layer is described as being "on" or "over" another layer or substrate, such layer may be directly on the other layer or substrate, or intervening layers may also be present. Moreover, similar reference numerals used throughout the drawings denote elements having the same or similar functions.

For illustrative purposes, exemplary embodiments of the invention will be described herein in the context of CMOS integrated circuit fabrication techniques, wherein test structures are designed to allow voltage contrast defect inspection of adjacent NMOS and PMOS active regions at the same time using a single, low energy electron beam scan. Exemplary test structures are designed to facilitate voltage contrast inspection of test structures formed in adjacent NMMOS and PMOS regions of a test region by enable discernible contrast differences between defective and no-defective test features in an SEM image. In particular, as explained hereafter in detail, exemplary test structures are designed with conductive structures that allow differential charging between defective and non-defective structures (or between defective and non-defective portions of a given structure) within adjacent NMOS and PMOS regions using a single low energy electron beam scan, despite the presence of p/n junctions or other elements that would otherwise prevent differential charging between defective and non-defective structures in at least one of the adjacent NMOS and PMOS regions as with conventional techniques described above with reference to FIG. 1.

Figure 2:
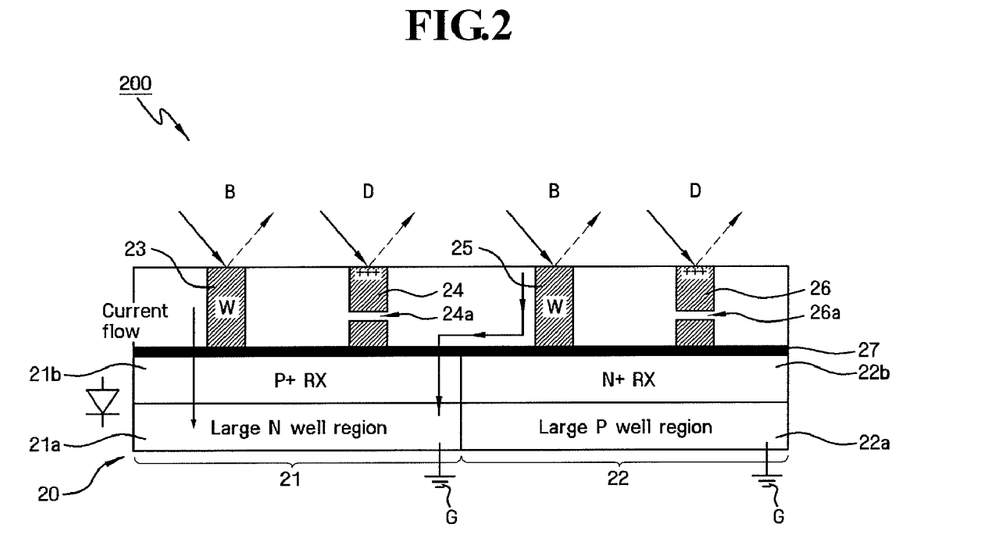
FIG. 2 is a schematic cross-sectional view of a semiconductor integrated test structure for voltage contrast inspection of a semiconductor wafer according to an exemplary embodiment of the invention.

FIG. 2 is a schematic cross-sectional view of a semiconductor integrated test structure for voltage contrast inspection of a semiconductor wafer according to an exemplary embodiment of the invention. More specifically, FIG. 2 schematically illustrates a test structure (200) that is designed to detect electrical defects such as voids within metal contacts/vias and residues at the bottom of contact/via holes using voltage contrast inspection techniques, according to an exemplary embodiment of the invention. In FIG. 2, the test structure (200) is formed in a dedicated test region (20) of a semiconductor wafer comprising adjacent first and second active regions (21) and (22). The first active region (21) comprises a p-doped active region (21b) formed in an n-well region (21a), and the second active region (22) comprises an n-doped active region (22b) formed in a p-well region (22a). A conductive pattern (27) is formed the first and second regions (21) and (22), wherein at least a portion of the conductive pattern is formed bridging the diffusion regions (21b) and (22b) to electrically connect the p-doped and n-doped active regions (21b) and (22b). An insulating layer (28) is formed on the conductive pattern (27) and over the first and second active regions (21) and (22). A pattern of contact plugs including contacts (23, 24, 25 and 26) are formed in the insulating layer (28) in contact with the conductive pattern (27) at various locations.

The metal contacts (23-26) may be part of a pattern of dummy contacts formed in the test structure region (20) of an IC chip (die region) of the wafer, which correspond to, and are representative of, a pattern of contact features of an integrated circuit formed within some other region of the IC chip. For instance, the pattern of contacts (23-26) may represent a pattern of contact plugs that are formed to connect active devices in a circuit region to a first level of metallization. The conductive pattern (27) provides a conductive path that allows electrical charge that is generated in the metal contacts (23-26) from the electron bean scan to be dissipated to ground G through the forward biased p/n junction (21b/21a) (when charge build up is positive) or through the forward biased p/n junction (22a/22b) (when charge build up is negative). This allows the contacts (23-26) in both regions (21) and (22) to be simultaneously inspected using one scan at a given landing energy.

By way of specific example, assume that the contacts (23, 24, 25 and 26) are formed of tungsten and that the test region (20) in FIG. 2 is scanned using a low landing energy electron beam. As discussed above with reference to FIG. 8, a low landing energy scan causes positive charge to accumulate in the contacts (23, 24, 25 and 26). The charge that accumulates in the non-defective contacts (23) and (25) would be conducted by the conductive layer (27) to the first region (21) and discharged to substrate ground G through the forward biased p/n junction (21b/21a). On the other hand, positive charge that accumulates on the defective contacts (24) and (26) would be electrically isolated from the conductive layer (27) due to the void defects (24a) and (26a), respectively.

In this regard, the conductive layer (27) is a conductive structure that is electrically coupled to substrate ground to allow differential charging between defective and non-defective structures within adjacent regions (21) and (22) using a single low energy electron beam scan, whereby accumulated charge on non-defective contacts (23) and (25) in both active regions (21) and (22) would be discharged to ground G (i.e., maintain the non-defective contacts at ground potential), while the defective contacts (24) and (26) would charge to a higher potential. The differential charge accumulation would modulate the intensities of the secondary electron emission such that the non-defective contacts (23) and (25) would appear in the SEM image as bright regions, whereas the defective contacts (24) and (26) with opens/voids (24a) and (26b), respectively, would appear in the SEM image as dark regions.

The exemplary embodiment of FIG. 2 is to be contrasted with the conventional embodiment of FIG. 1, where the positive charge accumulation on contact (15) is unable to be dissipated in the second region (12) due to the revised biased p/n diode (12a/12b). Thus, in contrast to FIG. 1, the exemplary test structure of FIG. 2 obviates the need to perform a second e-beam scan at high landing energy to check the contacts (25) and (26) in the second region (22), which eliminates the problems discussed above.

The exemplary test structure (200) in FIG. 2 can be fabricated in one or more designated test structure regions concurrently with each level of a CMOS integrated circuit fabrication process to inspect for defects at a given process stage. For example, the exemplary test structure of FIG. 2 can be used to at different stages of fabrication to inspect for possible defects such as such as voids within metal contacts, as well as residues at the bottom of contact/via holes. In particular, the exemplary test structure (200) of FIG. 2 may be formed in the test structure region (20) using a conventional CMOS fabrication process. For example, the well regions (21a) and (22a) and diffusion regions (21b) and (22a) in respective active regions (21) and (21) may be formed using conventional CMOS twin-well and ion implantation processes, and formed having pattern dimensions, layouts, etc, representative of those active regions of an integrated circuit to be inspected.

The conductive layer (27) may foe formed of a metallic material using a conventional metal deposition, etching, and patterning processes suitable for CMOS fabrication. In one exemplary embodiment, the conductive layer (27) may be a metal silicide layer that is formed using a self-aligned silicide CMOS process known in the art, in which a metal silicide film having a low resistivity may be formed on poly gate electrodes and on source/drain regions of CMOS and PMOS transistors, for example. The conductive layer (27) may be formed by depositing a metal layer (e.g., Ti) on the substrate, performing an annealing process to form a silicide layer, and selectively removing portions of the metal layer that remain in an unreacted state.

As noted above, in one exemplary embodiment of the invention where the test structure (200) is formed having a pattern of dummy contacts for voltage contrast inspection of defect mechanisms in the plug fabrication process, the conductive layer (27) would be formed in the active regions (21) and (22) having a layout pattern sufficient to provide a continuous conductive path between the p-doped diffusion region (21b) and each location in the first and second regions (21) and (22) where a dummy contact is expected to be formed. In one embodiment, the conductive layer (27) is designed to be in contact with each dummy contact and provide a continuous conductive path to the p-doped diffusion region (21b) and provide a discharge path to substrate ground to facilitate voltage contrast inspection for defects at various stages of a plug fabrication process.

In particular, after the conductive layer (27) is formed, the insulating layer (28) would be formed using conventional techniques. Thereafter, an etch process (e.g., RIE) would be performed to form a pattern of contact openings in the insulation layer (28) by etching opening in the insulating layer (28) clown to the conductive layer (27) using known techniques (e.g., RIE). The pattern of contact openings would correspond to the pattern of dummy contacts to be formed in the first and second regions (21) and (22). At this stage of fabrication, an e-beam inspection process could foe performed by scanning the test structure region (20) with a low energy electron beam to examine the contact openings for voltage contrast defects in an SEM image.

in the absence of defect mechanisms within the etch process when forming contact openings in the insulating layer (28), the etch process is expected to terminate at, or slightly below, the surface of the portion of the underlying conductive layer (27) exposed by the contact openings. When no defects are present in the test structure region (20) (e.g., under etched holes, etch residues at base of contacts, etc.), an expected voltage potential pattern results from the electron beam scan. For example, as a result of electron beam inspection, the contact holes would appear as bright spots in the SEM image as the positive charge build up on the surface the conductive layer (27) exposed by the contact openings in the insulating layer (27) would be discharged to substrate ground via the forward biased p/n junction (21b/21a). In this regard, the conductive layer (27) allows for voltage contrast inspection of contact openings in both regions (21) and (22) with one e-beam scan.

On the other hand, when defects are present in the test structure, the scanned test structure will have a pattern of voltage potentials that differs from the expected pattern of voltage potentials, thereby enabling detection of voltage contrast defects. For example, defect mechanism in the etch process may result in defective contact openings being formed in the insulating layer (28), including for example, partially open contacts due to under etching the insulation layer (i.e., the etch terminates before exposing the underlying conductive layer) or contact openings having residues, debris, stringers at the base of the contact openings, etc. The conductive layer (27) allows for differential charging between the bottom (base) surfaces of non-defective and defective contact openings, resulting in readily detectible contrast differences in an SEM image. For example, partially open contact openings with insulating material at the base would appear darker in shade as compared to fully opened contact holes with the conductive layer exposed as the base.

At a subsequent stage of production, the contact openings within the test region (20) are filled with conductive material such as tungsten forming dummy contacts concurrently with contacts in the integrated circuits. At this level, another SEM inspection can he performed scanning the test region (20) as discussed above to inspect for potential defects (e.g., voids, etc.) in the contacts.

Figure 3:
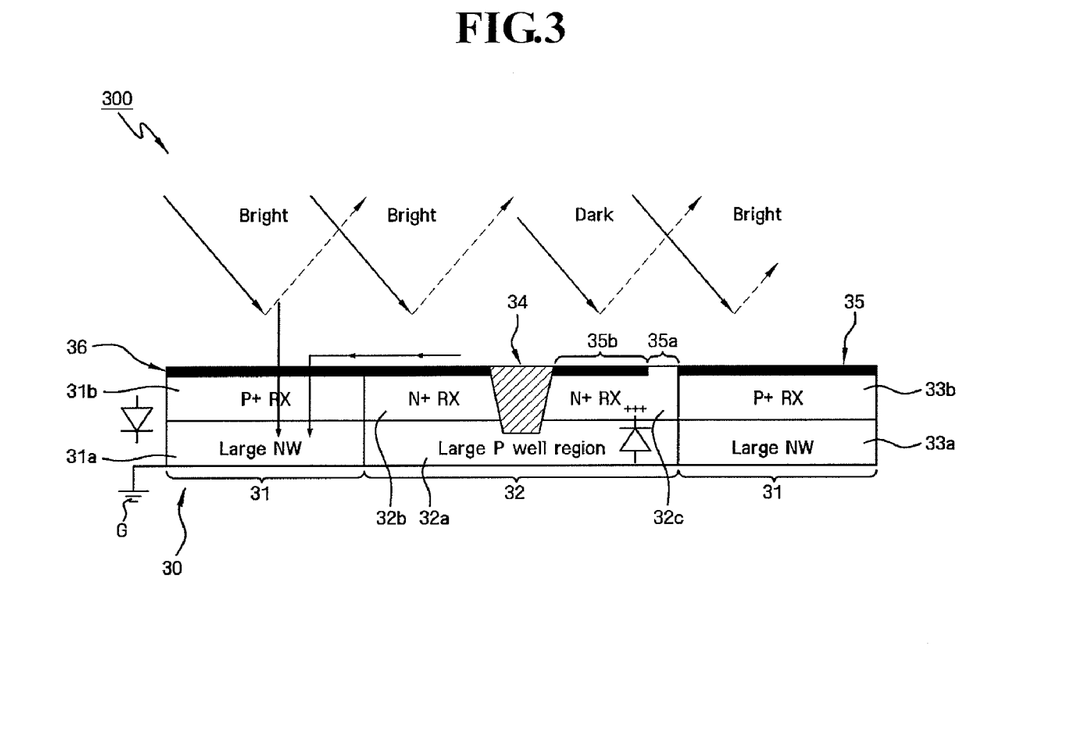
FIG. 3 is a schematic cross-sectional view of a semiconductor integrated test structure for voltage contrast inspection of a semiconductor wafer according to another exemplary embodiment of the invention.

FIG. 3 is a schematic cross-sectional view of a semiconductor integrated test structure for voltage contrast inspection of a semiconductor wafer according to another exemplary embodiment of the invention. More specifically, FIG. 3 schematically illustrates a test structure (300) to inspect formation of conductive patterns such as silicide patterns using voltage contrast inspection techniques, according to an exemplary embodiment of the invention. In FIG. 3, the test structure (300) is formed in a dedicated test region (30) of a semiconductor wafer comprising adjacent active regions including a first active region (31), a second active region (32) and a third active region (33). In the exemplary embodiment, the first active region (31) may be a PMOS region comprising an n-well region (31a) and a p+ diffusion region (31b), and the second active region (32) may be an NMOS region comprising a p-well region (32a) and n+ diffusion regions (32b) and (32c), and the third active region (33) may be a PMOS region comprising an n-well region (33a) and a p+ diffusion region (33b). A shallow trench isolation structure (34) is formed to isolate the n+ diffusion regions (32b) and (32c) in the second active region (32).

A conductive pattern (36) is formed bridging the first and second regions (31) and (32) and electrically connecting the p-doped and n-doped diffusion regions (31b) and (32b). A conductive pattern (35) is formed bridging the second and third regions (32) and (33) and electrically connecting the p-doped and n-doped diffusion regions (33b) and (32c). The conductive patterns (35) and (36) may be metal silicide lines that are formed to have dimensions, layouts, lengths, widths, etc., representative of metal silicide lines and patterns formed on drain/source diffusion regions of CMOS integrated circuits, wherein the test structure (300) is used to inspect silicide formation. By forming bridging connections between the silicide patterns on the adjacent p/n diffusion regions (31b/32b) and (33b/332c), the test structure (300) can be used to test silicide formation in adjacent active regions using a single scan and landing energy.

In particular, when the test structure (300) is scanned with a low landing energy electron beam, positive charge accumulation in the conductive pattern (36) will be discharged to substrate ground G through the forward biased p/n junction (31b/31a), while positive charge accumulation in the conductive pattern (35) will foe discharged to substrate ground G through the forward biased p/n junction (33b/33a). The charge accumulation in the portions of the conductive patterns (36) and (35) formed on the respective n+ diffusion regions (32b) and (32c) will be discharged when there is an electrical path (continuity) in the conductive patterns from the second region (32) to the respective first and third regions (31) and (33). On the other hand, if a portion of the conductive pattern (35, 36) is isolated in the second region (32) due to a discontinuity, the charge will accumulate in the isolated portions of the conductive patterns (35, 36) in the second region causing the isolated portions to appear as dark regions.

For instance, as depicted in FIG. 3, a void (35a) in the conductive pattern (35) results in isolation of the portion (35b) of the conductive pattern (35), which prevents accumulated charge on the portion (35b) to foe discharged to ground via the p/n junction (33b/33a) of the third region (33). Consequently, the isolated portion (35b) will appear in an SEM image as a dark region, which indicates the presence of an electrical defect such as open circuit, missing portion of conductive pattern, etc.

Figure 6:
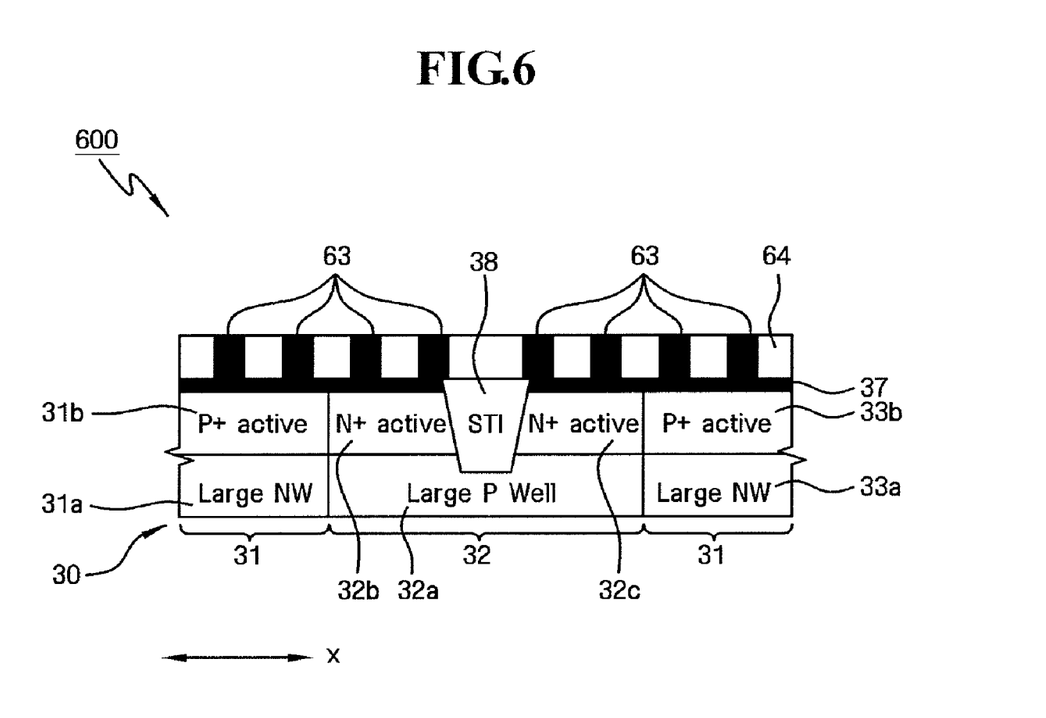
FIG. 6 is a schematic cross-sectional view of a semiconductor integrated test structure for voltage contrast inspection of a semiconductor wafer according to another exemplary embodiment of the invention.

FIG. 6 is a schematic cross-sectional view of a semiconductor integrated test structure for voltage contrast inspection of a semiconductor wafer according to another exemplary embodiment of the invention. More specifically, FIG. 6 schematically illustrates a test structure (600) that may be designed using a combination of the conceptual test structure frameworks of FIGS. 2 and 3 to inspect formation of a conductive pattern (37) such as a silicide pattern, having a discontinuity in the region (32) by an isolation region (33), to inspect the etching of contact openings in an insulating layer (64) and to inspect the metallic plugs (63) at different stages of production using voltage contrast inspection techniques, as previously described.

It is to be understood that FIGS. 2, 3 and 6 are general, high-level schematic depiction of exemplary test structures to illustrate fundamental concepts of the present invention. In this regard, various types of test structures can be designed based on the general frameworks, but having actual layouts/patterns/features, etc. that are specifically designed to detect particular defect mechanisms for a given type of integrated circuit and for a given semiconductor fabrication process. The test structures can be formed in dedicated test regions on a wafer during to enable voltage contrast defect inspection at different stages of production. In one embodiment, test structures are designed to nave an expected grayscale pattern in an SEM image when there are no defects present in the scanned test structure. When the scanned test structure has a grayscale pattern that differs from the expected pattern, a defect is deemed present within the test structure, which can be readily identified through voltage contrast defect analysis. In the exemplary embodiments, Since the test structure is designed having pattern dimensions, layouts, etc, representative of those features in the accompanying integrated circuit, the presence of defective features in the test structure are indicative of defects in the integrated circuit.

Figure 4A:
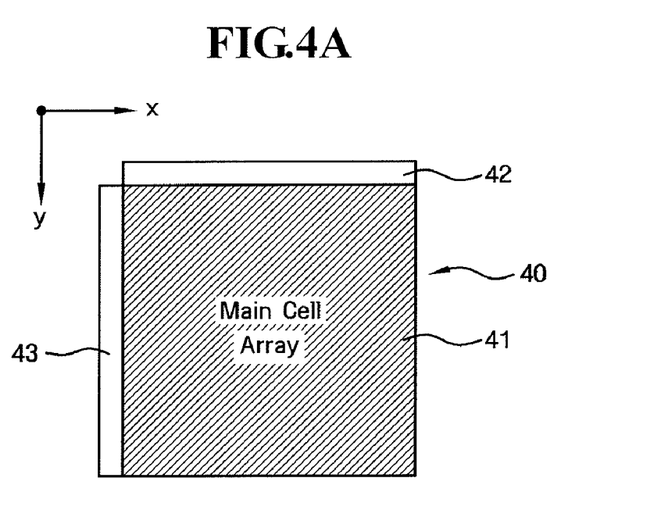

FIGS. 4A~4E schematically illustrate a method for voltage contrast inspection using semiconductor integrated test structures according to an exemplary embodiment of the invention, which is based on a combination of the exemplary frameworks discussed above with reference to FIGS. 2, 3 and 6. More specifically, FIGS. 4A~4E schematically illustrate a method for voltage contrast inspection using integrated test structures in an arrayed device cell according to an exemplary embodiment of the invention. FIG. 4A is a top plan schematic view of a device array (40) of an IC chip formed in the surface of a silicon wafer. The device array (40) may comprise a main device cell array (41) and peripheral regions (42) and (43). The device cell array (41) may be a CMOS memory cell array (DRAM, SRAM, Flash, EEPROM, etc) or CMOS pixel array of an image sensor, etc, wherein the peripheral region (42) may be a designated test structure region (or dummy region) having integrated test structures that are formed with pattern dimensions and layouts representative of those structures formed in the main cell array (42).

Figure 4B:
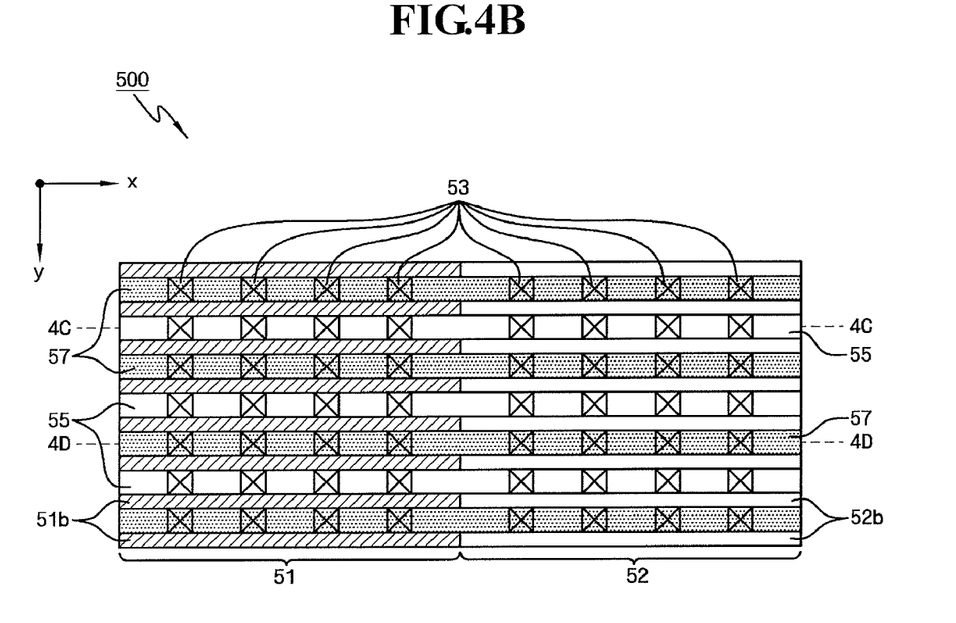
FIGS. 4B~4E are schematic views of an integrated test structure that may be formed in the designated test structure region of the device array to detect defects of features within the device array.
Figure 4C:
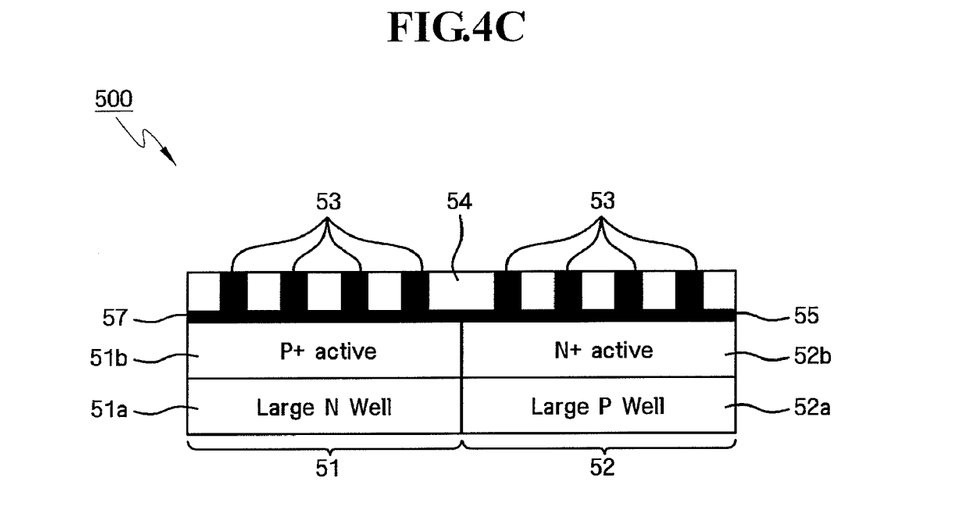
Figure 4D:
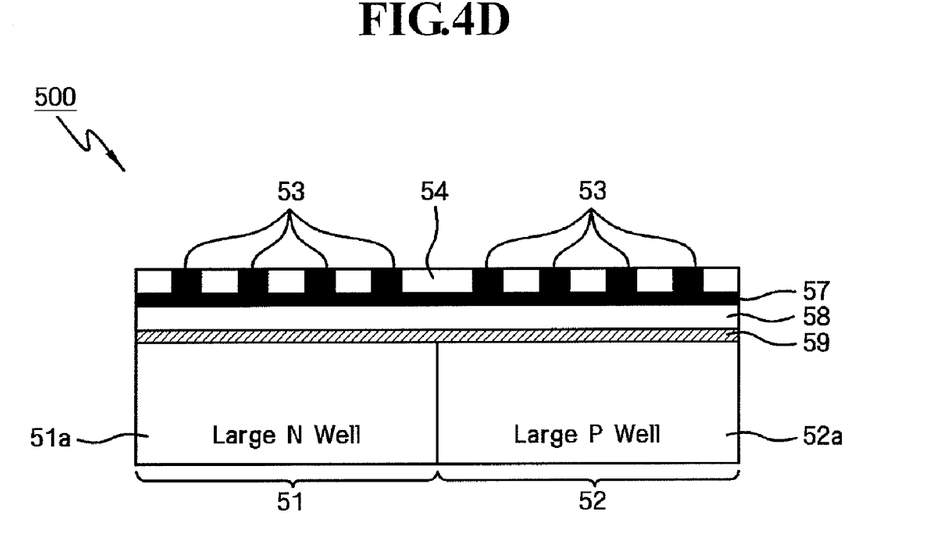
Figure 4E:
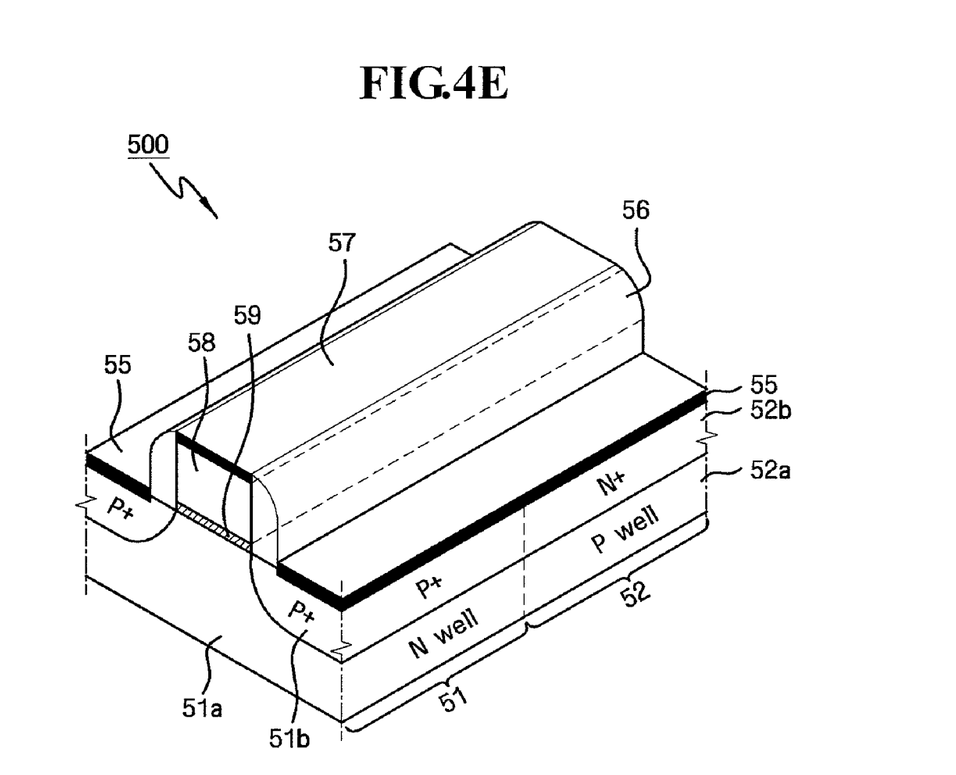

In general, FIGS. 4B~4E are schematic views of an integrated test structure (500) that may be formed in the dummy cell region (42) to detect defects of gate line and contact structures formed in the main cell array (41) at different stages of a FEOL process during CMOS integrated circuit fabrication. FIG. 4B is a schematic top plan view of a portion of the integrated test structure (500) formed in the dummy cell region (42) in FIG. 4A. FIG. 4C is a cross-sectional schematic view of the integrated test structure (500) along line 4C-4C in FIG. 4B. FIG. 4D is a cross-sectional schematic view of the integrated test structure (500) along line 4D-4D in FIG. 4B. FIG. 4E is a schematic perspective 3D view of the integrated test structure (500).

As shown in FIGS. 4B~4E, the exemplary test structure (500) includes alternating, adjacent first and second substrate regions (51) and (52) formed along an x-direction in the dummy region (42). The first region (51) may be a PMOS region comprising an n-veil region (51a) and a p+ diffusion region (51b), and the second region (52) may be an NMOS region comprising a p-well region (52a) and an n+ diffusion region (52b). The n-well and p-well regions of the first and second regions (51) and (52) in the dummy region (42) extend into and across the main cell region (41) in the y-direction. The test structure (500) comprises a plurality of alternating, parallel conductive lines (55) and (57) (or dummy lines) that extend along the dummy region (42) in the x-direction. A plurality of dummy contacts (53) are formed in an insulation layer (54) contacting various at points along the conductive lines (55) and (57). The conductive lines (55) may be metal silicide lines that are formed on the diffusion regions (51b) and (52b) in the dummy region (42). The conductive lines (55) are formed to bridge adjacent p+ and n+ diffusion regions (51b) and (52b) and thus provide a conductive path to ground the contacts (53) formed over the n+ region (52b) through the p/n junction (51b/51a) of the first region (51). Moreover, the conductive lines (57) may be metal silicide layers that are formed as part of dummy gate structures formed in the dummy region (42) bridging the alternating n-well and p-well regions (51a) and (52a).

In particular, as specifically illustrated in FIGS. 4D and 4E, the test structure (500) may include dummy gate structures that longitudinally extend along the x-direction of the dummy region (42) bridging adjacent n-well and p-well regions (51a) and (52a). The dummy gate structures comprise a stack of layers including a silicide layer (57), a polysilicon layer (53) and a gate insulation layer (59), as well as sidewall spacers (56) formed on the side walls of the gate structure. The dummy gate structures include a gate electrode formed by the polysilicon layer (58) and silicide layer (57), which is electrically isolated from the substrate regions via the gate insulating layer (59) and sidewall spacers (56).

The exemplary test structure (500) comprises dummy features that are formed concurrently with features within the main cell array (41), for example, using standard CMOS fabrication techniques. The dummy features of the test structure (500) are formed to have pattern dimensions and/or layouts representative of those features formed in the main cell array (41). For instance, the dummy silicide lines (55) and (57) of the test structure (500) formed in the dummy region (42) may be formed to have line widths and/or layout spacing that correspond to those found in main cell region (41). Moreover, the dummy contacts (53) of the test structure (500) may be formed to have aspect ratios and/or layout spacing (pitch) which correspond to those contacts formed in the main cell region (41). The exemplary test structure (500) can be used to inspect for certain fail modes (e.g. poor silicide formation, voids in contacts, etc.) at certain stages of a CMOS process flow when fabricating integrated circuits on the semiconductor wafer.

For example, FIG. 4E illustrates the exemplary test structure (500) at a stage of an FEOL process in which the metal silicide layers (55) are formed over the diffusion regions (51b, 32b) and the metal silicide layers (57) are formed over the polysilicon lines (58) forming dummy polycide gate electrodes. The test structure (500) can be formed using a standard CMOS self aligned salicidation process, as is well-known in the art. After salicidation, an e-beam inspection process can be performed for voltage contrast inspection of the test structure (500) to detect various electrical/physical defects of metal silicide lines (55) and (57) such as poor silicide formation, discontinuities along the lines (e.g., electrical opens), regions of abnormally high or low electrical resistance, etc., as well as gate electrode shorts.

In particular, in the exemplary test structure (500) depicted in FIGS. 4B and 4E, for example, the metal silicide lines (55) formed on the diffusion regions (51b, 52b) are electrically coupled to the substrate ground, whereas the metal silicide lines (57) forming the gate electrodes are electrically Isolated from the substrate ground via the gate insulating layers (59) and spacers (56). In this regard, since the silicide layers (55) and (57) are designed to be alternately grounded or floating, in the absence of a fail mode, the metal silicide lines (55) and (57) would be expected to appear in the SEM image as alternating bright or dark lines with equal/consistent shades. Indeed, when irradiated with a low landing energy electron beam providing an secondary electron emission yield greater than 1, the electrically floating metal silicide lines (57) would charge to a positive voltage and may appear as dark lines in the SEM image, while the grounded metal silicide lines (55) would not be positively charged (positive charge is discharged to ground) and may appear as bright lines. The alternating ground metal silicide lines (55) and floating metal silicide lines (57) would be differentially charged resulting in a potential difference easily observed in an SEM image.

More specifically, when examined in the SEM, assuming the dummy gate structures are electrically isolated (no shorts to substrate) and the silicide lines (57) are properly formed, the silicide lines (57) will be displayed at the same intensity when irradiated by an electron beam, e.g., non-defective silicide lines (57) forming the dummy gate structures would appear as dark lines with equal/consistent shade. However, when a dummy gate structure is defective (e.g., polysilicon-to-substrate leakage, gate conductor-to-self-aligned contact shorts, etc) allowing accumulated charge to be discharged to ground, the gate silicide line (57) (or portions thereof) of the defective dummy gate structure may appear at a level of brightness similar to that of a non-defective silicide line (55)) or a lighter shade of darkness as compared to dark shading at which floating silicide lines (57) appear for non-defective dummy gate structures.

Moreover, assuming the silicide lines (55) are properly formed, the silicide lines (55) would be displayed at the same intensity when irradiated by an electron beam, e.g., non-defective silicide lines (55) would appear as bright lines with equal/consistent brightness. Defects in silicide formation such as varied thickness, missing portions, etc., along the silicide lines (55) would display readily discernable variations in shading/tone as compared to constant level of brightness of non-defective, grounded silicide lines (55). Similarly, defects in silicide formation such as varied thickness, missing portions, etc., along the silicide lines (57) of the dummy gate structures would display readily discernable variations in shading/tone as compared to consistent level of darkness of non-defective, electrically floating silicide lines (57).

The test structure (500) can be used at a subsequent stage of CMOS fabrication after the insulation layer (54) is etched to form contact openings in the insulation layer (54) exposing portions of the silicide lines (55) and (57) where the contacts (53) are formed. An electron beam inspection process can be performed to detect for potential fail modes resulting from the etch process, e.g., over etching causing damage to the silicide lines (55) and (57), contact openings not properly exposed, residual insulating layer remaining within the contact openings, etc. In the absence of a fail mode, when irradiated with a low landing energy electron beam providing a secondary electron emission yield greater than 1, the contact openings in the insulating layer (54) exposing portions of the gate silicide lines (57) would appear in an SEM image as dark regions with equal/consistent intensity due to positive charge that accumulates on the floating silicide lines (57) when irradiated through the contact openings.

On the other hand, the contact openings in the insulating layer (54) exposing portions of the gate silicide lines (55) would appear in an SEM image as bright regions with equal/consistent intensity due to the discharge path from the silicide lines (57) to substrate ground, e.g., positive charge that accumulates on the exposed surfaces of the silicide lines (55) is discharged to substrate ground through the p/n (51b/51a) junction in the first region (51)).

The silicide lines (55) and (57) enable failure modes in the etch process to foe readily detected. For example, when the etch process results in residual insulating layer remaining within a given contact opening, the insulating layer would modulate the intensity of electron emission from the exposed surface of the silicide line in a way that would result in the given contact opening being displayed in the SEM image with an unexpected shade. For instance, a contact opening in which the underlying silicide line (57) is not exposed or partially exposed, etc, may appear brighter or lighter in shade in the SEM image as compared to the dark, shaded display of contact openings in which the underlying silicide line (57) is properly exposed. Moreover, a contact opening in which the underlying surface of the silicide line (55) is not exposed or partially exposed, etc, may appear darker in shade in the SEM image as compared to the brightness intensity displayed by contact openings in which the underlying surface of the silicide line (55) is properly exposed.

It is to be appreciated that test structures according to exemplary embodiments of the invention may be formed at appropriate regions of a semiconductor wafer to check the integrity of a given semiconductor fabrication process. For example, for a semiconductor wafer having an array of similar chips (dies), test structures can be formed in dedicated test regions of integrated circuits formed within the die regions, or at test regions located in scribe line regions between the chip regions on the wafer. The integrated test structures may be formed on actual production wafers or separate test wafers. The design, layout, amount and/or location of the test structures at each stage of production would vary depending on various factors such as the complexity of the integrated circuits being fabricated, the fabrication process employed the type of defects to be monitored, etc. In general, defects associated with a given process can result from manufacturing process variations, and such defects can vary depending on, e.g., the orientation, geometry and/or location of the features within the die region and/or over different regions of the wafer. Further, layout asymmetry and pattern density difference variations, for example, can lead to possible defect mechanisms. In each instance, the test structures at different stages of semiconductor fabrication would preferably be designed and arranged so that the defect densities of the test structures (as determined by voltage contrast inspection) would correlate to actual defect conditions of integrated circuits of product dies formed on a semiconductor wafer.

For instance, FIG. 4A illustrates an exemplary embodiment of the invention in which one or both of the peripheral regions (42) and (43) of the device array (40) may include test structures that are designed for voltage contrast inspection to determine possible fail modes within one or more stages of the process for fabricating integrated circuits in the array region (41). Assuming the device array (40) is a repeating pattern in each of a plurality of product dies formed on a semiconductor wafer, similar test structures may be formed in the peripheral region (42) and/or peripheral region (43) of each device array (40) in the different dies.

Figure 5:
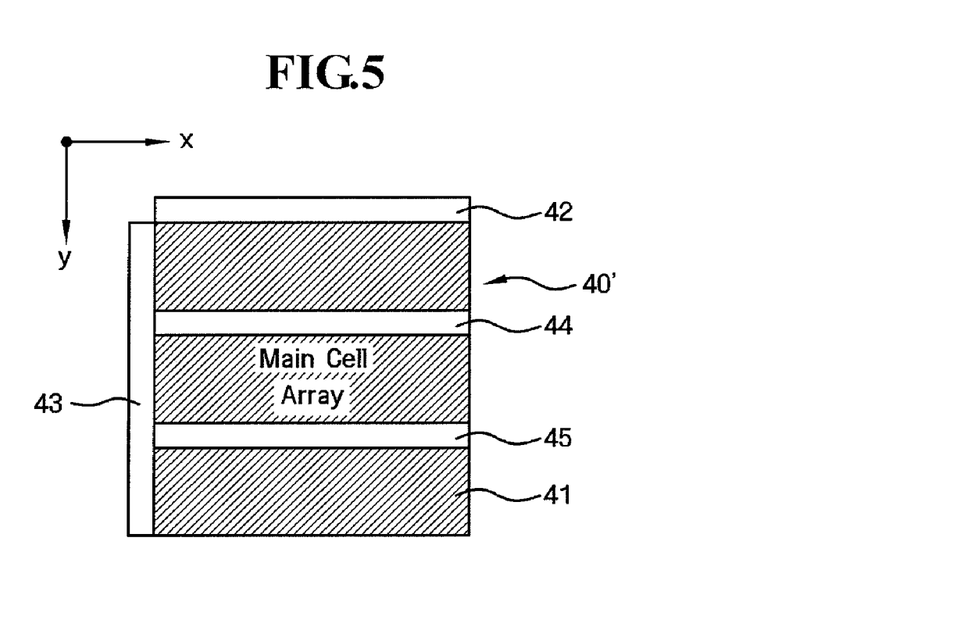
FIG. 5 is a top plan schematic layout view of a device array having designated test structure regions according to another exemplary embodiment of the invention.

In other exemplary embodiment, test structures may be formed in test regions within the device array, such as depicted in FIG. 5. In particular, FIG. 5 is a top plan schematic view of a device array (40') of an IC chip formed in the surface of a silicon wafer. The device array (40') is generally similar to the device array (40) in FIG. 4A including a main device cell array (41), and peripheral regions (42) and (43). In FIG. 5, the device array (40') may includes one or more dummy regions (44), (45) that are dedicated regions in which test structures are formed with pattern dimensions and layouts representative of those repeating pattern of structures formed in the main cell array (41) or different patterns of features formed in different regions of the array (41). The dummy regions (44) and (45) may include test structures that are specifically designed for the given application based on the exemplary conceptual test structure architectures as discussed above with references to FIGS. 2, 3 and 6, for example.

The exemplary test structures of FIGS. 2, 3 and 6, for example, are based on CMOS device array layout techniques in which a twin-well process is used to form alternating adjacent/abutting n-well and p-wells in the semiconductor substrate along a given direction across the array (e.g., in the x-direction of the devices arrays (40) and (40') of FIGS. 4A and 5, respectively) as well as alternating and abutting p+ and n+ diffusion regions along the given direction (e.g., x-direction). It is to be understood that the CMOS test structures are merely exemplary, and other CMOS device array layout techniques may be applied, such as illustrated in FIG. 7.

Figure 7:
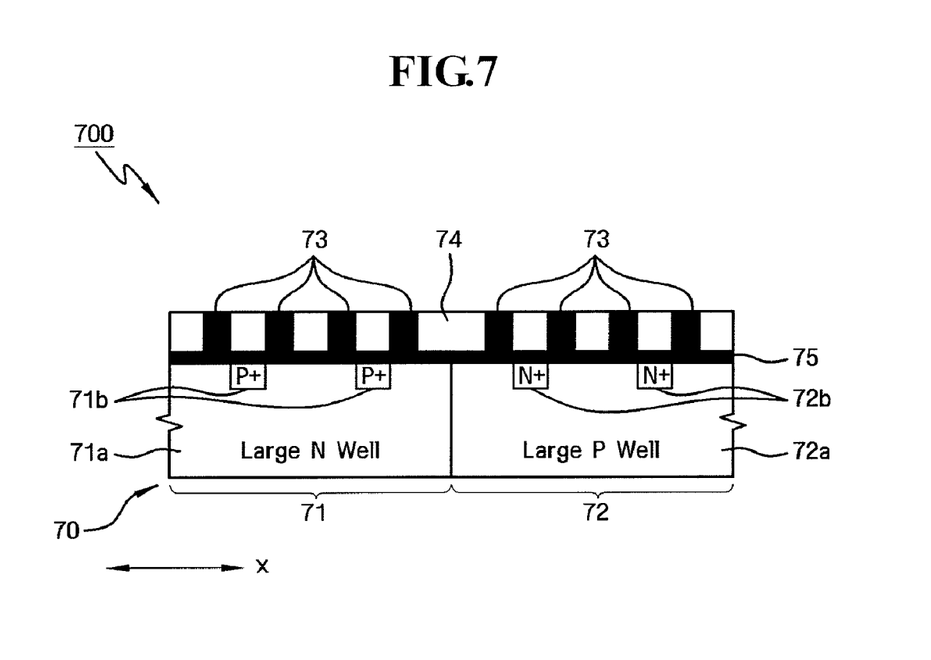
FIG. 7 is a schematic cross-sectional view of a semiconductor integrated test structure for voltage contrast inspection of a semi-conductor wafer according to another exemplary embodiment of the invention.

In particular, FIG. 7 illustrates an exemplary test structure (700) is formed in a dedicated test region (70) of a semiconductor wafer comprising adjacent first and second active regions (71) and (72). The first active region (21) comprises p-doped active regions (71b) formed in an n-well region (71a), and the second active region (72) comprises n-doped active regions (72b) formed in a p-well region (72a). As compared to FIG. 2, for example, the p-doped diffusion regions (71b) and n-doped diffusion regions (72b) are separated from each other and extend in the direction of the n-well (71a) and p-well (72a), respectively. A conductive pattern (75) may be formed to bridge the first and second regions (71) and (72) and electrically connect the p-doped and n-doped active regions (71b) and (72b). An insulating layer (74) is formed on the conductive pattern (75) and over the first and second active regions (71) and (72). A pattern of contact plugs (73) are formed in the insulating layer (74) in contact with the conductive pattern (75). Using similar concepts described herein, the test structure (700) can be designed for voltage contrast inspection to detect failure modes in silicide and plug formation.

While the present invention has been particularly shown and described with reference to exemplary embodiments thereof, it will be understood by those skilled in the art that various changes in form and details may be made therein without departing from the spirit and scope of the invention as defined by the appended claims.

We claim:
1. A semiconductor device, comprising:
an integrated device array formed on a semiconductor substrate, wherein a portion of the integrated device array comprises a test structure region, wherein the test structure region comprises:
adjacent first and second active regions, wherein the first active region comprises a p-doped diffusion region formed in an n-well and wherein the second active region comprises an n-doped diffusion region formed in a p-well;
a conductive pattern formed on the first and second active regions to electrically connect the p-doped and n-doped active regions;
an insulating layer formed on the conductive pattern; and
one or more contact plugs formed in the insulating layer in contact with the conductive pattern.
2. The semiconductor device of claim 1, wherein the conductive pattern is formed of a silicide.
3. The semiconductor device of claim 1, wherein the integrated circuit comprises a memory cell array.
4. The semiconductor device of claim 3, wherein the test structure region further comprises a dummy gate line that is formed on the first and second active regions and electrically isolated from the n-doped and p-doped active regions.
5. The semiconductor device of claim 4, wherein the conductive pattern is a conductive line that extends parallel to the dummy gate line.
6. The semiconductor device of claim 4, wherein the test structure region comprises one or more dummy contact plugs formed in the insulating layer in contact with the dummy gate line.
7. The semiconductor device of claim 1, wherein the test structure region further comprises an isolation structure formed in the n-doped active region to form an electrical discontinuity of the conductive pattern.
8. The semiconductor device of claim 1, wherein the n-doped and p-doped active regions are of equal depth.
9. The semiconductor device of claim 1, wherein the n-doped and p-doped active regions directly contact each other.
10. A semiconductor device, comprising:
an integrated device array formed on a semiconductor substrate, wherein a portion of the integrated device array comprises a test structure region, wherein the test structure region comprises:
adjacent first, second and third active regions, wherein the first active region comprises a first well region and a first diffusion region formed in the first well region, wherein the second active region comprises a second well region and a second diffusion region formed in the second well region, and wherein the third active region comprises a third well region and a third diffusion region formed in the third well region;
wherein the first well region, third well region and second diffusion region are doped with a first conductivity type, and wherein the second well region and the first and third diffusion regions are doped with a second conductivity type opposite the first conductivity type;
a conductive pattern formed on the first, second and third active regions, wherein a first portion of the conductive pattern is formed in contact with, and bridging, the first diffusion region and the second diffusion region, and wherein a second portion of the conductive pattern is formed in contact with, and bridging, the second diffusion region and the third diffusion region; and an isolation structure formed in the second diffusion region and electrically isolating the first and second portions of the conductive pattern.

11. The semiconductor device of claim 10, wherein the conductive pattern is a metal silicide.

12. The semiconductor device of claim 10, wherein the integrated circuit comprises a device array.

13. The semiconductor device of claim 12, wherein the test structure region is formed within an inner region of the device array.

14. The semiconductor device of claim 10, wherein the test structure region further comprises:
   an insulating layer formed over the first, second and third active regions; and
   a dummy contact plug formed in the insulating layer in contact with the first portion of the conductive pattern; and
   a second dummy contact plug formed in the insulating layer in contact with the second portion of the conductive pattern.

15. The semiconductor device of claim 10, wherein the first, second and third diffusion regions are substantially of equal depth.

16. The semiconductor device of claim 10, wherein the second diffusion region is disposed between, and in contact with, the first and third diffusion regions.

17. The semiconductor device of claim 10, wherein the second diffusion region is an n-doped diffusion region.

18. The semiconductor device of claim 10, wherein the conductive pattern comprises a third portion formed on and bridging the first and second active regions and electrically isolated from the semiconductor substrate.

19. The semiconductor device of claim 18, wherein the third portion is part of a dummy transmission line.

* * * * *